United States Patent
Xiong et al.

(10) Patent No.: US 12,408,504 B2
(45) Date of Patent: *Sep. 2, 2025

(54) FLIP-CHIP LIGHT EMITTING DIODE AND MANUFACTURING METHOD THEREOF

(71) Applicant: XIAMEN SAN'AN OPTOELECTRONICS CO., LTD., Xiamen (CN)

(72) Inventors: Wei-Ping Xiong, Xiamen (CN); Shu-Fan Yang, Xiamen (CN); Chun-Yi Wu, Xiamen (CN); Chaoyu Wu, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/462,397

(22) Filed: Sep. 6, 2023

(65) Prior Publication Data
US 2023/0413599 A1 Dec. 21, 2023

Related U.S. Application Data

(63) Continuation of application No. 17/337,361, filed on Jun. 2, 2021, now Pat. No. 11,785,793, which is a (Continued)

(30) Foreign Application Priority Data

Jun. 22, 2016 (CN) .......................... 201610450480.0

(51) Int. Cl.
*H10K 50/84* (2023.01)
*H01L 21/28* (2006.01)
(Continued)

(52) U.S. Cl.
CPC ........... *H10H 29/142* (2025.01); *H01L 21/28* (2013.01); *H10H 20/0137* (2025.01);
(Continued)

(58) Field of Classification Search
CPC . H01L 33/00–648; H01L 33/10; H01L 33/22; H01L 33/42; H01L 33/0093; H01L 51/5237; H10K 50/84
See application file for complete search history.

(56) References Cited

U.S. PATENT DOCUMENTS 11,056,669 B2 * 7/2021 Yang ........................ H01L 33/42
11,785,793 B2 * 10/2023 Xiong ...................... H01L 33/10
257/43
(Continued)

*Primary Examiner* — Eric K Ashbahian
(74) *Attorney, Agent, or Firm* — Syncoda LLC; Feng Ma

(57) ABSTRACT

A flip-chip light emitting diode includes a light-emitting epitaxial laminated layer having a first surface, and a second surface opposing the first surface, and including a first semiconductor layer, an active layer, and a second semiconductor layer, wherein the first surface is a roughened surface; a transparent bonding medium layer over the first surface of the light-emitting epitaxial laminated layer and bonded with a transparent substrate; and a first electrode and a second electrode respectively over a first electrode region and a second electrode region over the second surface of the light-emitting epitaxial laminated layer.

17 Claims, 15 Drawing Sheets

Related U.S. Application Data continuation of application No. 16/221,706, filed on Dec. 17, 2018, now Pat. No. 11,056,669, which is a continuation of application No. PCT/CN2017/085661, filed on May 24, 2017.

(51) Int. Cl.
  *H10H 20/01* (2025.01)
  *H10H 20/80* (2025.01)
  *H10H 20/814* (2025.01)
  *H10H 20/82* (2025.01)
  *H10H 20/825* (2025.01)
  *H10H 20/832* (2025.01)
  *H10H 20/833* (2025.01)
  *H10H 20/85* (2025.01)
  *H10H 29/14* (2025.01)

(52) U.S. Cl.
  CPC .......... *H10H 20/80* (2025.01); *H10H 20/814* (2025.01); *H10H 20/82* (2025.01); *H10H 20/825* (2025.01); *H10H 20/833* (2025.01); *H10H 20/835* (2025.01); *H10H 20/85* (2025.01); *H10K 50/84* (2023.02)

(56) References Cited

U.S. PATENT DOCUMENTS

| | | | |
|---|---|---|---|
| 2002/0093023 A1* | 7/2002 | Camras | H01L 33/20 257/E33.07 |
| 2005/0287687 A1* | 12/2005 | Liao | H01L 33/0066 438/22 |
| 2012/0138991 A1* | 6/2012 | Chuang | H01L 33/10 257/E33.068 |
| 2014/0103314 A1* | 4/2014 | Satoh | H10K 50/856 257/40 |
| 2014/0225138 A1* | 8/2014 | Yang | H01L 33/02 257/95 |
| 2016/0049562 A1* | 2/2016 | Inada | H01L 33/58 362/351 |
| 2016/0126433 A1* | 5/2016 | Huang | H10H 20/82 438/69 |
| 2016/0211425 A1* | 7/2016 | Tsujimoto | H10H 20/855 |

\* cited by examiner

FLIP-CHIP LIGHT EMITTING DIODE AND MANUFACTURING METHOD THEREOF

CROSS-REFERENCE TO RELATED APPLICATIONS

This is a continuation of U.S. patent application Ser. No. 17/337,361 filed on Jun. 2, 2021, which is a continuation of U.S. patent application Ser. No. 16/221,706 filed on Dec. 17, 2018, which in turn is a continuation of, and claims priority to, International Application No. PCT/CN2017/085661 filed on May 24, 2017, which claims priority to Chinese Patent Application No. 201610450480.0 filed on Jun. 22, 2016. The disclosures of the above-referenced applications are hereby incorporated by reference in their entirety.

BACKGROUND

In recent years, light emitting diodes (LEDs) are widely applied and plays an increasingly important role in various applications such as a display system, a lighting system and an automobile tail light.

With the successful development of epitaxial growth technique of organometallic chemistry, AlGaInP-based materials are developed and used for manufacturing high-power and high-luminance LEDs that emits red light and yellow light.

SUMMARY

The inventors of the present application have recognized that, a thick substrate is prone to absorbing light from the light source, and a thin chip may result in chip crack and poor yield. In a general process structure, the transparent substrate is required to be >80 µm, and the surface is a polishing plane. Therefore, in the flip-chip quaternary light emitting diode structure as shown in FIG. 1, light from the radiation light source is readily absorbed by material in the substrate, and the light emitting surface is likely to reflect light back to the active layer structure, causing light loss.

In an aspect, a method is provided for manufacturing a quaternary wafer chip having a patterned transparent substrate on the surface, which solves the above problems and enhances operation feasibility and light emitting efficiency.

In some embodiments, the manufacturing method for a flip-chip light emitting diode includes: (1) providing a transparent substrate and a temporary substrate, and bonding the transparent substrate with the temporary substrate; (2) grinding and thinning the transparent substrate; (3) providing a light-emitting epitaxial laminated layer, having a first surface and a second surface opposite to each other, which further comprises a first semiconductor layer, an active layer and a second semiconductor layer; (4) forming a transparent bonding medium layer over the first surface of the light-emitting epitaxial laminated layer, and bonding the transparent bonding medium layer with the transparent substrate; (5) defining a first electrode region and a second electrode region over the second surface of the light-emitting epitaxial laminated layer, and manufacturing a first electrode and a second electrode; and (6) removing the temporary substrate.

In some embodiments, step (1) further includes: patterning the first main surface of the transparent substrate and bonding the first main surface, which serves as the bonding surface, with the temporary substrate.

In some embodiments, the transparent substrate should be able to be bonded with the temporary substrate via adhesive with high temperature resistance and good stability in step (1), and the temporary substrate can be made of glass, ceramic or sapphire.

In some embodiments, the thinned transparent substrate in the step (2) should be thinner than 80 km.

In some embodiments, the transparent bonding medium layer formed in the step (4) is a combination of one or more layers of silicon oxide layer, silicon nitride layer and aluminum oxide layer, such as: $Al_2O_3/SiO_2$, $SiN_x/SiO_2$, $SiN_x/Al_2O_3/SiO_2$.

In some embodiments, step (3) also includes the patterning of the first surface of the light-emitting epitaxial laminated layer. Step (4) also includes: after forming a transparent bonding medium layer over the first surface of the light-emitting epitaxial laminated layer, flattening the surface of the transparent bonding medium layer via chemical mechanical polishing, wherein, the roughness value Ra<1 nm.

In some embodiments, step (4) includes: forming a transparent medium layer over the first surface of the light-emitting epitaxial laminated layer, wherein, the upper surface has grid-shaped or array-shaped recess region; depositing a patterned transparent bonding medium layer over the transparent medium layer, which fills up the recess region of the transparent medium layer, and the upper surface is at the same plane with the upper surface of the transparent medium layer.

Further, in step 4), deposit a transparent bonding medium layer over the transparent medium layer and fine polish the surface till the transparent medium layer is exposed, hence the transparent bonding medium layer fills up the recess region of the transparent medium layer, and the upper surfaces of these two layers are at a same plane, and then polish the surfaces.

In some embodiments, Step 5) also includes: arranging pyramid-shaped recess arrays over the second surface of the exposed light-emitting epitaxial laminated layer, wherein, each pyramid-shaped recess is arranged in the vertical shadow area of the transparent bonding medium layer to reflect light from the vertical shadow area of the transparent bonding medium layer; as a result, light can deviate from this shadow area, thus eliminating light reflection from the transparent bonding medium layer to the inside part of the chip.

In another aspect, a flip-chip LED chip structure is provided, which can be manufactured by any of the above-mentioned methods.

Embodiments of the present disclosure can have one or more of the following advantageous effects: (I) the patterned substrate surface can change the angle of incidence of the totally-reflected light, which prevents light from being reflected back and re-absorbed by the semiconductor structure, thus increasing light extraction efficiency; (II) the thickness of the thin transparent substrate can be <80 µm, making operation yield more stable and avoiding light absorption by materials.

The other features and advantages of some embodiments of the present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

To more clearly illustrate some of the embodiments of the disclosure, the following is a brief description of the drawings. The drawings are only illustrative of some embodiments, and for those of ordinary skill in the art, other drawings of other embodiments can become apparent based on these drawings.

Figure 1:
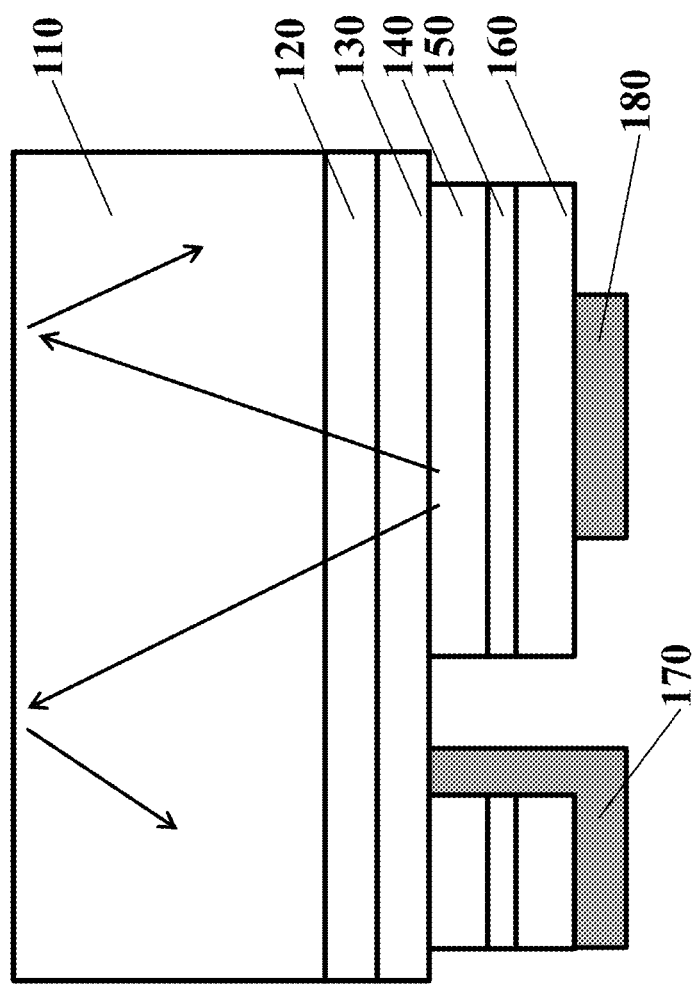
FIG. 1 illustrates a flip-chip light emitting diode chip according to some implementations.

IN THE DRAWINGS 110, 210: transparent substrate; 120, 220: transparent bonding layer; 130, 230: p-type window layer; 140, 240: P-type semiconductor layer; 150, 250: active layer; 160, 260: n-type semiconductor layer; 170, 270: p electrode; 180, 280: n electrode; 200: growth substrate; 300: temporary substrate; 310: adhesive layer.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. It should be noted that the embodiments and their characteristics described in this disclosure may be combined with each other and such technical proposals are deemed to be within the scope of this disclosure without departing from the spirit of this disclosure.

Transparent bonding can be realized for the quaternary LED by bonding a semiconductor structure with a transparent substrate, which can be manufactured in a horizontal structure, and then be extended to a flip-chip structure that matches with RGB applications, such a structure is illustrated in FIG. 1.

In some embodiments, the first semiconductor layer and the second semiconductor layer are semiconductor materials of opposite types. For example, if the first semiconductor layer is an n-type semiconductor, then the second semiconductor layer can be a p-type semiconductor; and if the first semiconductor layer is a p-type semiconductor, then the second semiconductor layer should be a n-type semiconductor.

The following embodiments disclose a method for manufacturing a quaternary wafer chip having a patterned transparent substrate on the surface. At first, bond the transparent substrate with a temporary substrate, and then conduct thinning process. Next, bond the transparent substrate with the epitaxy wafer via transparent bonding technology. Remove the growth substrate and manufacture the electrode. Finally, remove the temporary substrate to obtain a thin flip-chip light emitting diode, wherein, the transparent substrate plate can be as thin as less than 80 μm, making operation yield more stable and avoiding light absorption by materials.

Figure 2:
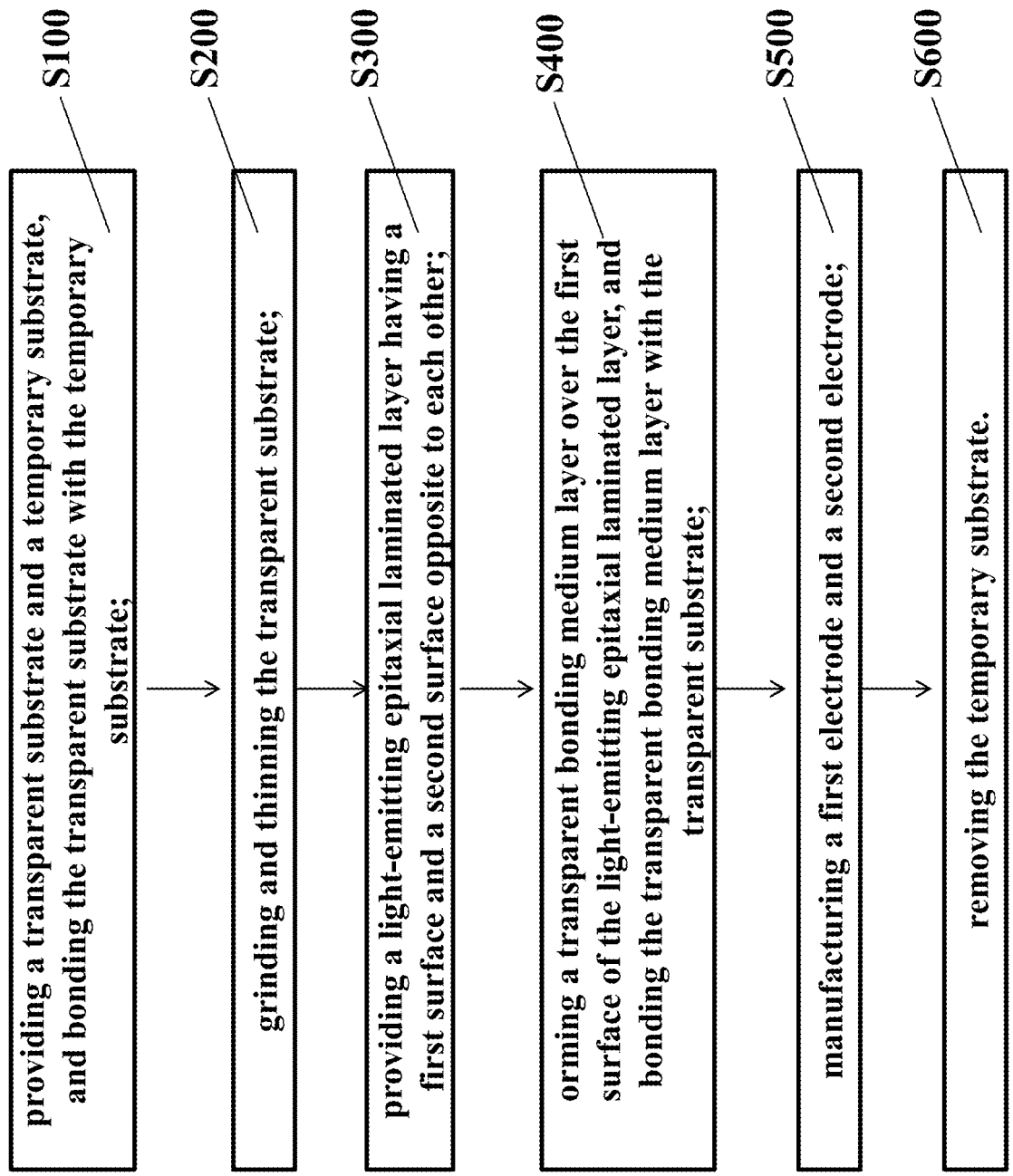
FIG. 2 is a flow diagram illustrating the manufacturing of a flip-chip light emitting diode according to some embodiments of the present disclosure.

FIG. 2 illustrates a flow chart for manufacturing a flip-chip light emitting diode according to the present disclosure, which mainly comprises steps S100-S600. Details are illustrated below in combination with FIGS. 3-10.

Figure 3:
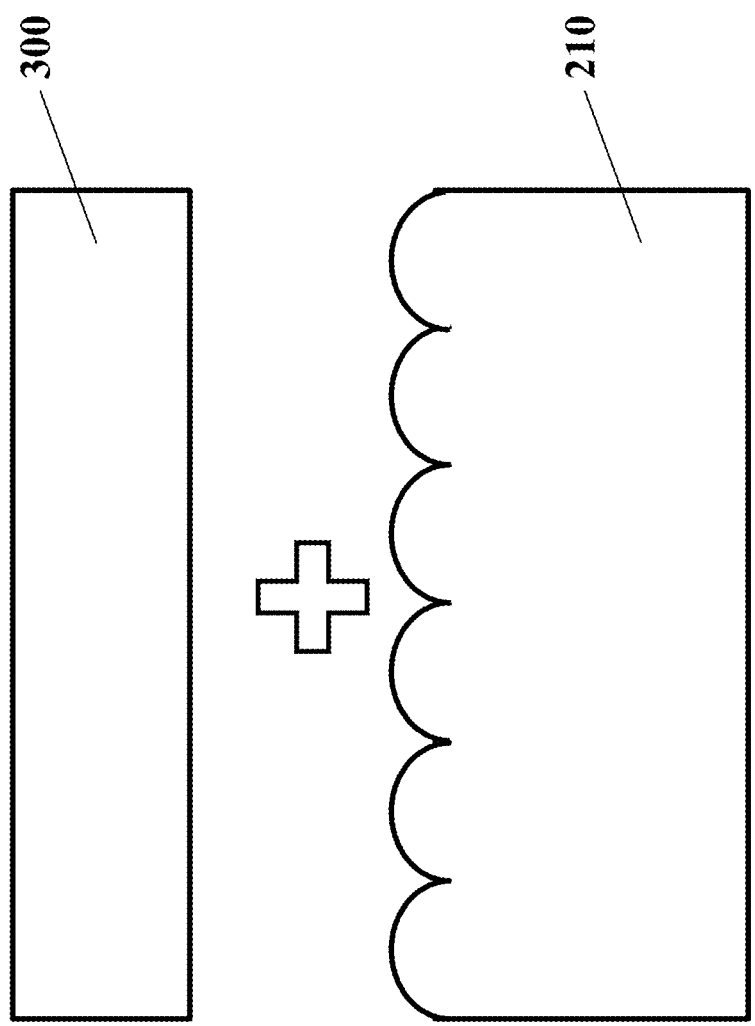
FIG. 3 is a schematic diagram illustrating a first step of the manufacturing of a flip-chip light emitting diode according to Embodiment 1.
Figure 4:
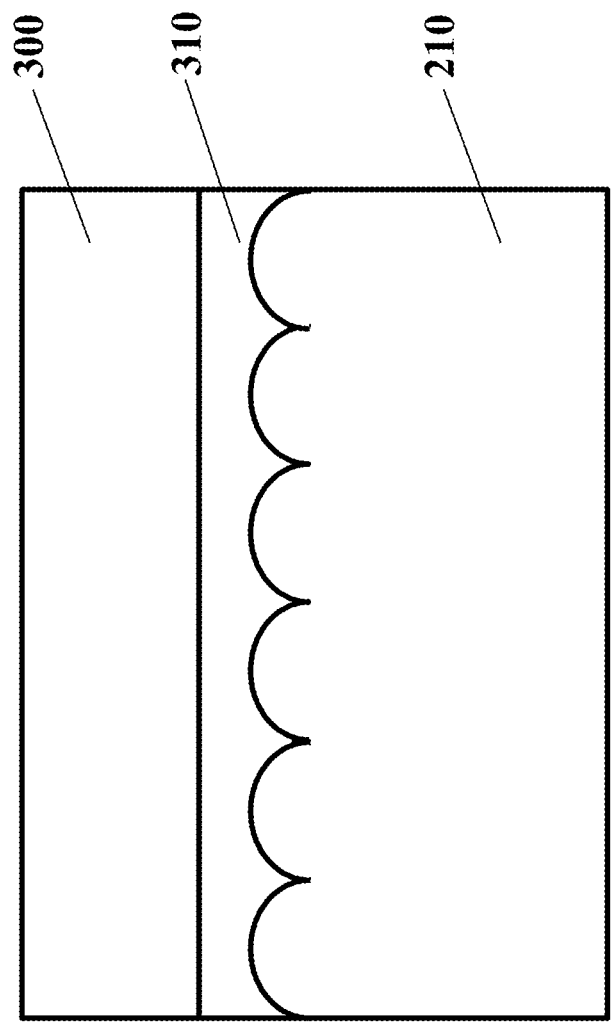
FIG. 4 is a schematic diagram illustrating a second step of the manufacturing of a flip-chip light emitting diode according to Embodiment 1.

At first, provide a transparent substrate 210 and a temporary substrate 300, and pattern the first main surface of the transparent substrate 210. Bond the transparent substrate with the temporary substrate 300 via the adhesive layer 310. The bonding surface of the transparent substrate is a patterned surface, which can be made of sapphire, aluminum nitride or glass. The patterned transparent substrate can be manufactured by different methods such as patterned sapphire substrate (PSS) technology; the temporary substrate 300 can be made of glass or ceramic; the adhesive layer 310 can be made of adhesive with high temperature resistance and good stability, such as BCB adhesive, as shown in FIGS. 3 and 4.

Figure 5:
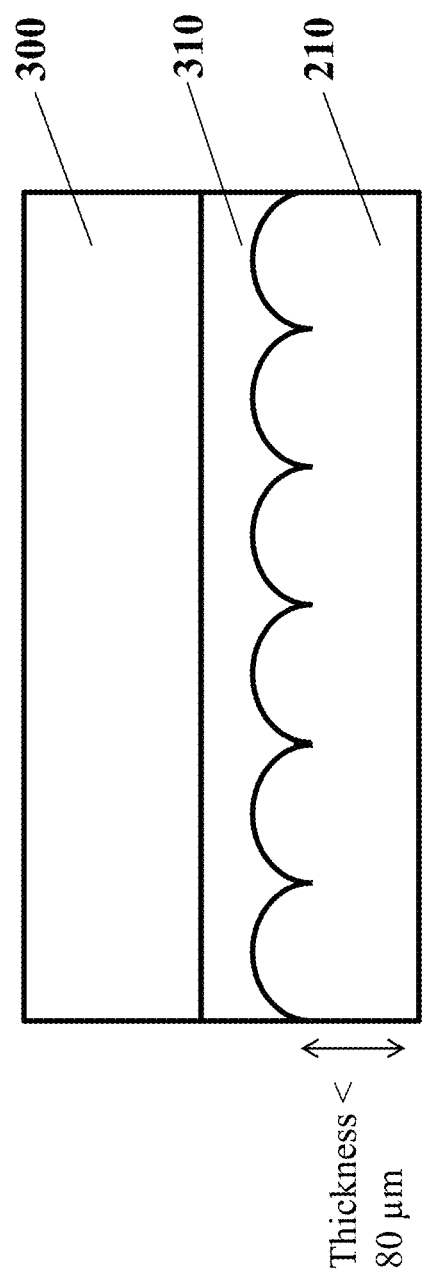
FIG. 5 is a schematic diagram illustrating a third step of the manufacturing of a flip-chip light emitting diode according to Embodiment 1.

Next, grind and thin the patterned transparent substrate 210 till less than 80 μm. The thinned transparent substrate is not readily broken thanks to the support from the temporary substrate 300, which guarantees subsequent process. As shown in FIG. 5, preferred thickness of the thinned transparent substrate 200 is 40-60 μm. In this embodiment, the thickness is 50 μm.

Figure 6:
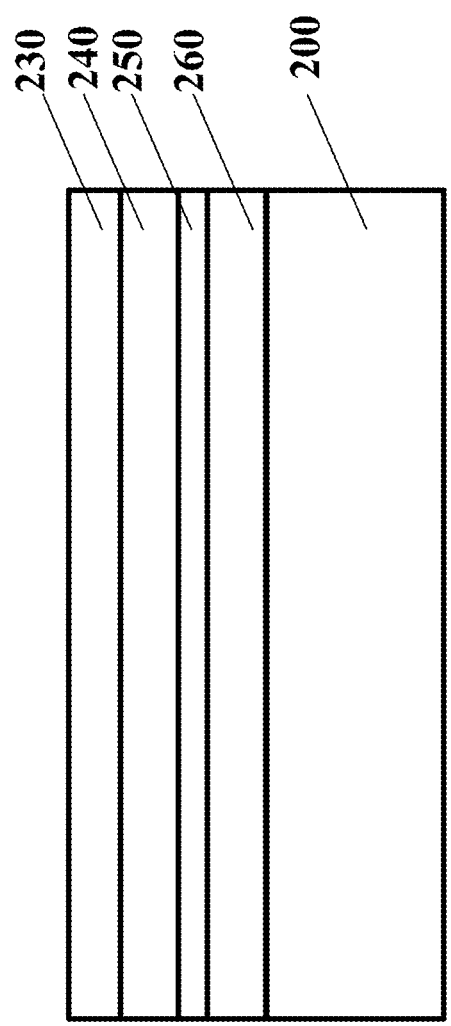
FIG. 6 is a schematic diagram illustrating a fourth step of the manufacturing of a flip-chip light emitting diode according to Embodiment 1.

Next, use a quaternary epitaxial wafer of MOCVD nucleation, the structure of which is as shown in FIG. 6. A common structure is acceptable, which generally comprises a growth substrate 200, an n-type semiconductor layer 260, an active layer 250, a p-type semiconductor layer 240 and a p-type window layer 230.

Figure 7:
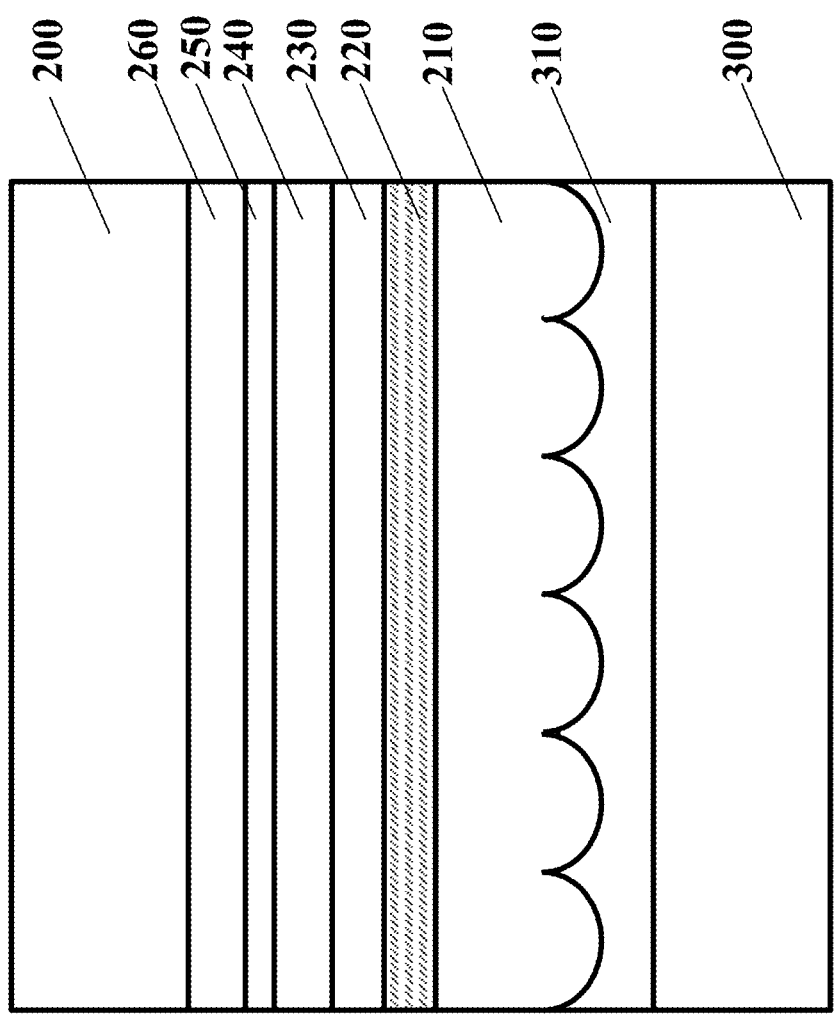
FIG. 7 is a schematic diagram illustrating a fifth step of the manufacturing of a flip-chip light emitting diode according to Embodiment 1.

Next, deposit a transparent bonding layer 220 over the p-type window layer 230 of the epitaxial wafer, which is bonded with the thinned transparent substrate 210, as shown in FIG. 7. The transparent bonding layer 220 is a combination of one or more layers of silicon oxide layer, silicon nitride layer and aluminum oxide layer, such as: $Al_2O_3/SiO_2$, $SiN_x/SiO_2$, $SiN_x/Al_2O_3/SiO_2$. For example, the transparent bonding layer 220 includes a first sub-layer with a relatively high refractive index formed on the p-type window layer 230, and a second sub-layer with a relatively low refractive index formed on the first sub-layer. The first sub-layer has a thickness of t less than 1 µm, preferably less than 500 nm, and most preferably 100 to 300 nm; the second sub-layer has a thickness of more than 1 m for example, preferably 1~3 µm. The second sub-layer is mainly used for bonding and connecting the transparent substrate 210 and the epitaxial layers, and can be one layer of silicon oxide layer. The first sub-layer can reduce the refractive index difference between the p-type window layer and the first sub-layer, thereby improving the light extraction efficiency. In this embodiment, $Al_2O_3/SiO_2$ is used, and bonding is undertaken under high-temperature and high-pressure, wherein, high temperature is 360° C., and high pressure is 150 MPa.

Figure 8:
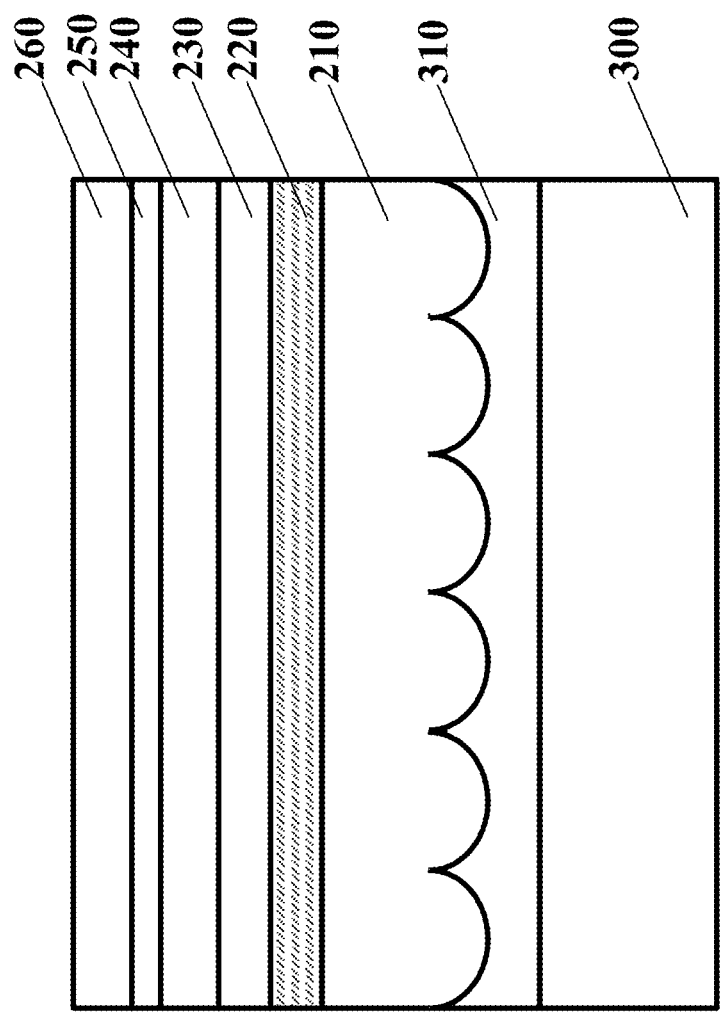
FIG. 8 is a schematic diagram illustrating a sixth step of the manufacturing of a flip-chip light emitting diode according to Embodiment 1.

Next, remove the growth substrate 200 of the epitaxial wafer, and expose the surface of the n-type semiconductor layer 260, as shown in FIG. 8. In this embodiment, remove the growth substrate via wet etching, wherein, the substrate removal agent is prepared by $NH_4OH$ and $H_2O_2$.

Figure 9:
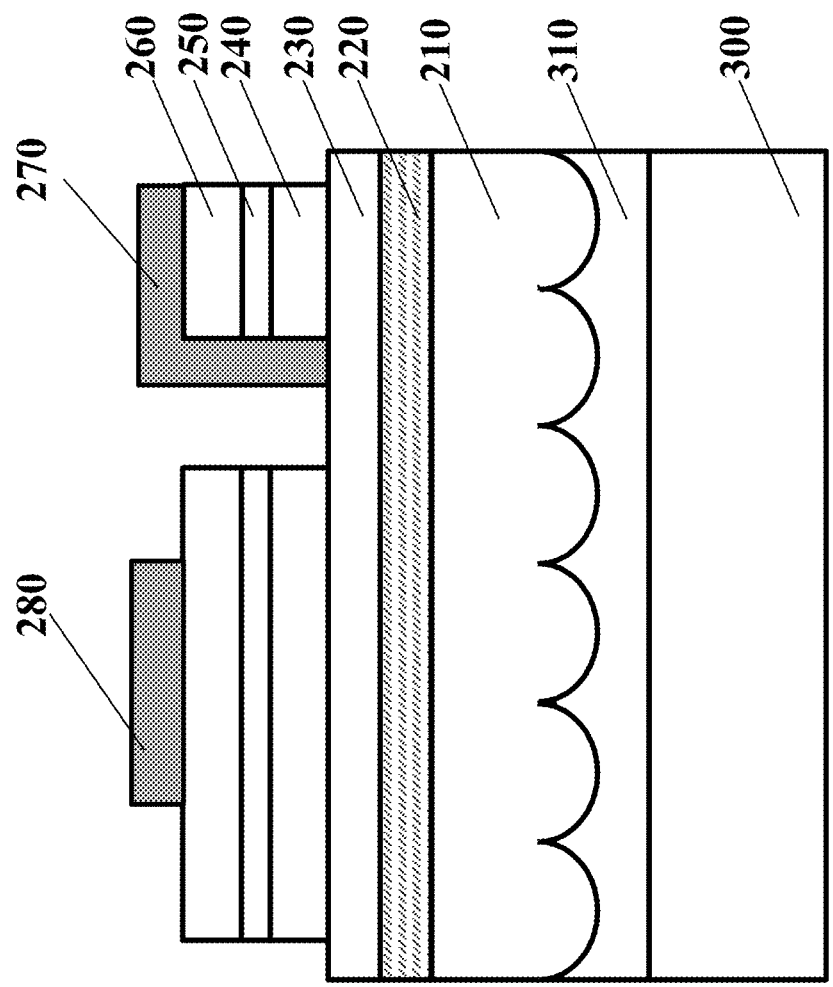
FIG. 9 is a schematic diagram illustrating a seventh step of the manufacturing of a flip-chip light emitting diode according to Embodiment 1.

Next, manufacture the p electrode 270 and the n electrode 280, as shown in FIG. 9. Specifically: define a p electrode region and an n electrode region over the n-type semiconductor layer surface. Etch the n-type semiconductor layer 260 and the active layer 250 of the p electrode region, and expose the p-type semiconductor layer 240. Manufacture the p electrode 270 made of beryllium gold over the exposed surface, which is taken as the chip anode. Manufacture the n electrode 280 in the n electrode region of the n-type semiconductor layer 260, which is taken as the chip cathode and also the reflector. In this embodiment, the material is Ag.

Figure 10:
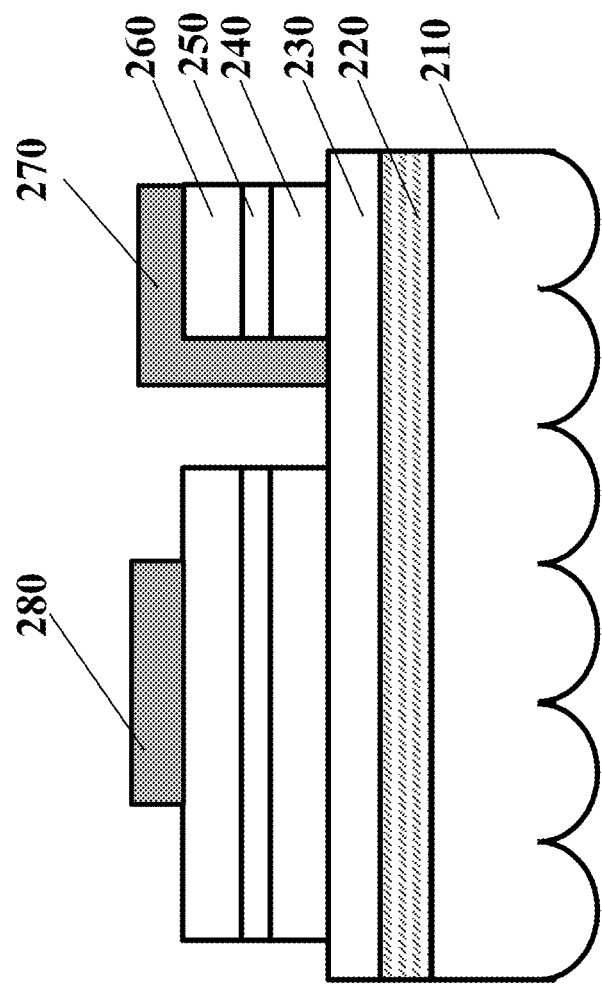
FIG. 10 is a schematic diagram illustrating an eighth step of the manufacturing of a flip-chip light emitting diode according to Embodiment 1.

Next, remove the adhesive with appropriate adhesive removal agent under appropriate conditions. The temporary substrate is also removed to expose the patterned transparent substrate surface, as shown in FIG. 10. After splitting, the material can be used in the package structure of the flip-chip without grinding operation.

Figure 11:
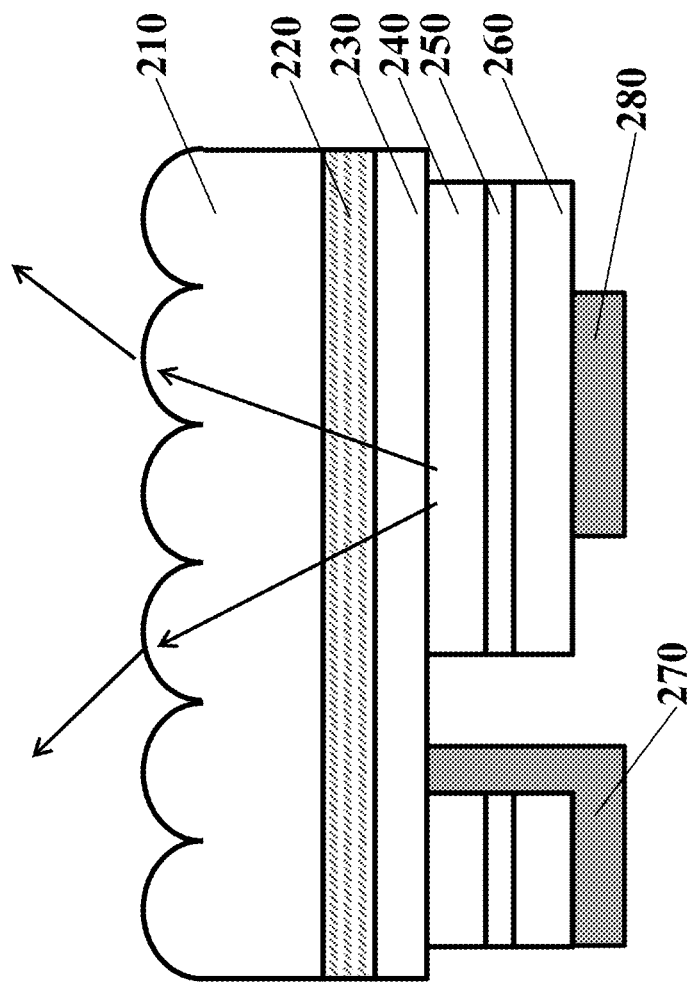
FIG. 11 is a light path analysis diagram of the flip-chip light emitting diode of Embodiment 1 which improves light extraction efficiency.

FIG. 11 is an optical path analysis diagram of the flip-chip light emitting diode, which improves light extraction efficiency. The patterned substrate surface can change the angle of incidence of the totally-reflected light, which prevents light from being reflected back and re-absorbed by the semiconductor structure, thus increasing light extraction efficiency; meanwhile, the thickness of the thin transparent substrate can be <80 µm, making the operation yield more stable and avoiding light absorption by materials.

Figure 12:
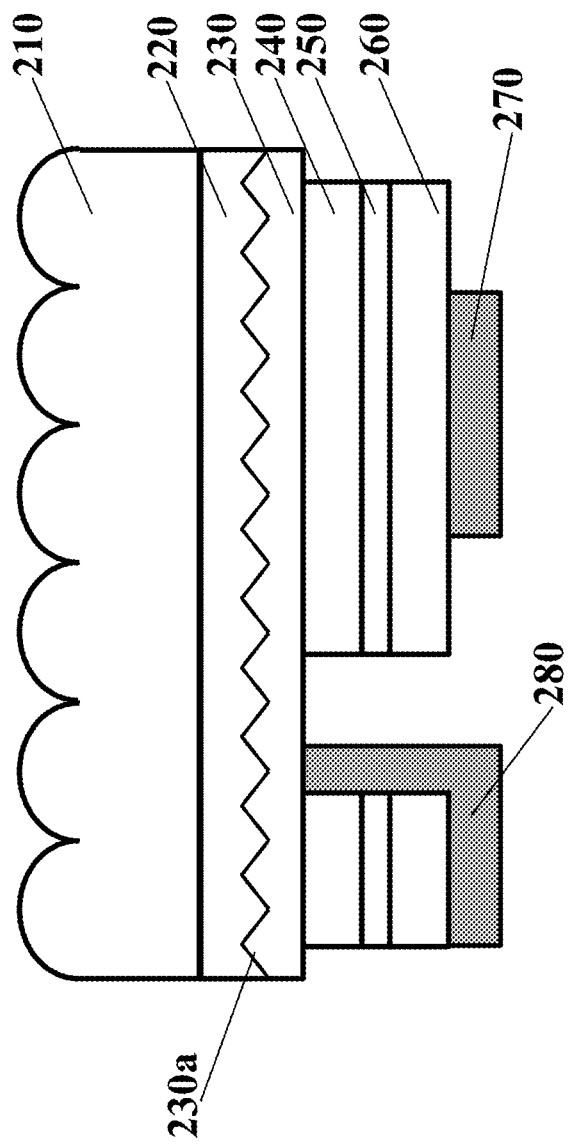
FIG. 12 shows the flip-chip light emitting diode chip of Embodiment 2.

FIG. 12 shows the flip-chip light emitting diode according to the second embodiment of the present disclosure. The difference of this embodiment and Embodiment 1 is that: rough the surface of the p-type window layer of the epitaxial wafer, which is taken as the bonding surface 230a. Deposit the transparent bonding layer 220 over the bonding surface and bond the transparent bonding layer with the transparent substrate. Specifically, wet etch the surface of the p-type window layer 230, which forms a roughened surface 230a. Next, deposit the transparent bonding layer 220 over the roughened surface 230a, and flatten the surface of the transparent bonding layer 220 till its roughness value Ra<1 nm, thus obtaining a flattened LED; in which, the surface is polished to required flatness in the manner of chemical mechanical polishing, with ESR-320 polishing agent and SUBA600SiO$_2$ polishing pad.

Figure 13:
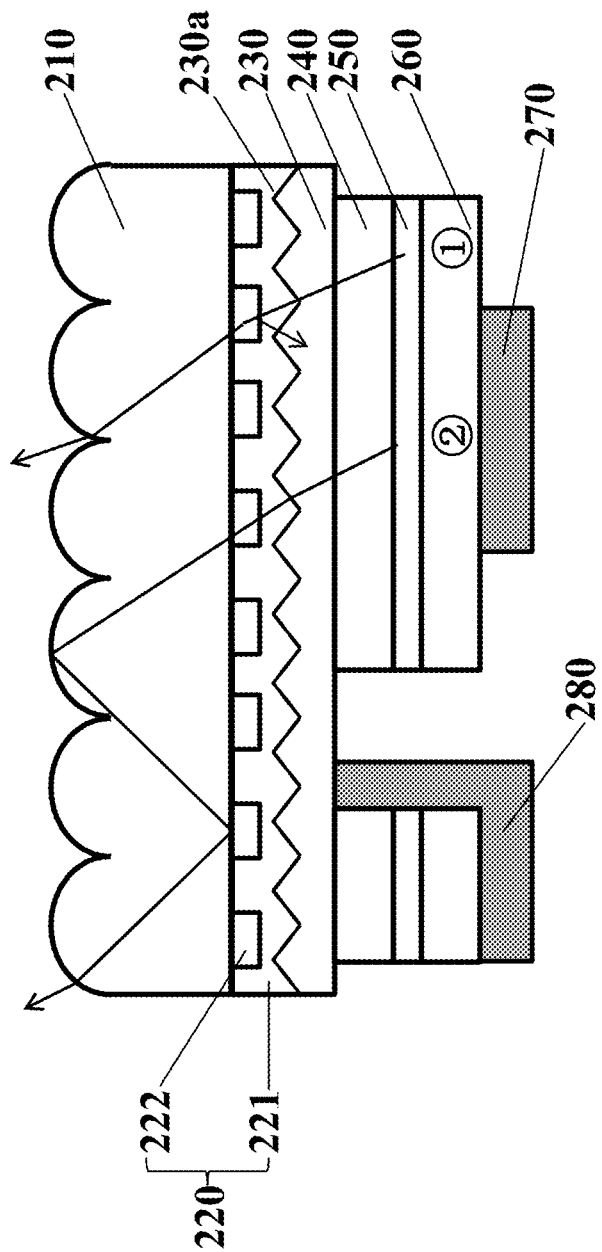
FIG. 13 shows the flip-chip light emitting diode chip of Embodiment 3, having a patterned transparent bonding layer.
Figure 14:
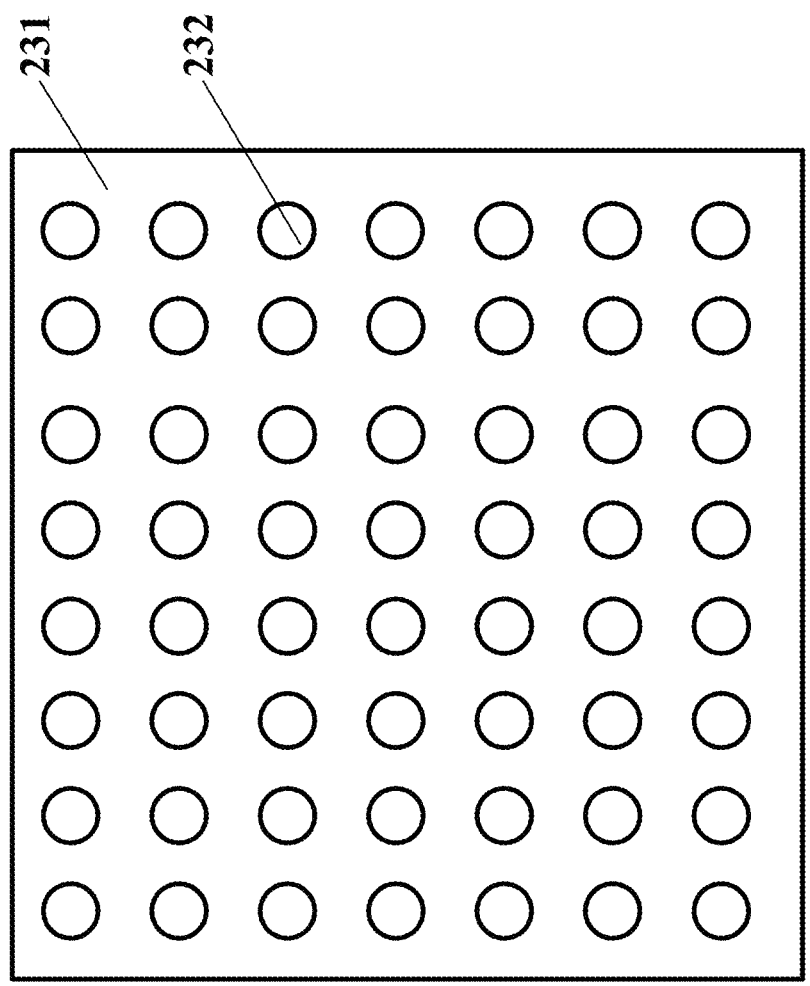
FIG. 14 is a top view of the patterned transparent bonding layer of the flip-chip light emitting diode as shown in FIG. 13.

FIG. 13 shows the flip-chip light emitting diode according to the third embodiment of the present disclosure. The difference of this embodiment and Embodiment 2 is that: the patterned transparent bonding medium layer 220 is composed of a high-refractivity transparent medium layer 221 and a patterned transparent bonding layer 222. The high-refractivity transparent medium layer 221 is over the surface of the p-type window layer 230, wherein, the upper surface is provided with a grid-shaped or array-shaped recess region; a patterned transparent bonding layer 222 fills up the recess region of the high-refractivity transparent medium layer 221, and the upper surface is at the same plane with the upper surface of the transparent medium layer 221. Specifically, deposit the high-refractivity transparent medium layer 221 over the surface of the p-type window layer 230, and define a circular array over the upper surface of the transparent medium layer 221 via photoetching. Etch the area within the circle to form an array-shaped recess region, as shown in FIG. 14. Deposit a bonding layer 222 with thickness of 1-2 m over the transparent medium layer 221. Then, fine polish the surface of the bonding medium layer 222 till the transparent medium layer 221 is exposed. In this embodiment, the high-refractivity transparent medium layer 221 is made of $Al_2O_3$, with thickness of 3 µm. In the circular array, circle diameter is 3-6 m, circle center distance is 5-10 µm, and etching depth is 1-2 µm. The bonding layer 222 is made of $SiO_2$.

In this embodiment, the light-emitting medium of the semiconductor surface is changed to high-refractivity transparent material, which greatly increases light extraction efficiency from the semiconductor to the transparent substrate. Light emitted to the high-refractivity transparent medium is divided into two portions. Some light, such as light 1, is emitted to the bonding layer 222, and reflection, refractivity or total reflection take place over the lower surface. This portion of light is similar to that of the original bonding structure; some light is directly emitted to the transparent substrate through the high-refractivity transparent medium, which increases light into the transparent substrate, and therefore increases probability of light extraction, such as light 2. In this case, the transparent bonding layer 222 also serves as a reflector, which partially reflects light back to inside part of the chip from the upper surface of the transparent substrate to prevent it from being emitted to and absorbed by the semiconductor layer. To sum it up, this embodiment provides a flip-chip light emitting diode with a patterned transparent bonding layer, which effectively improves light extraction efficiency and guarantees bonding strength and yield.

Figure 15:
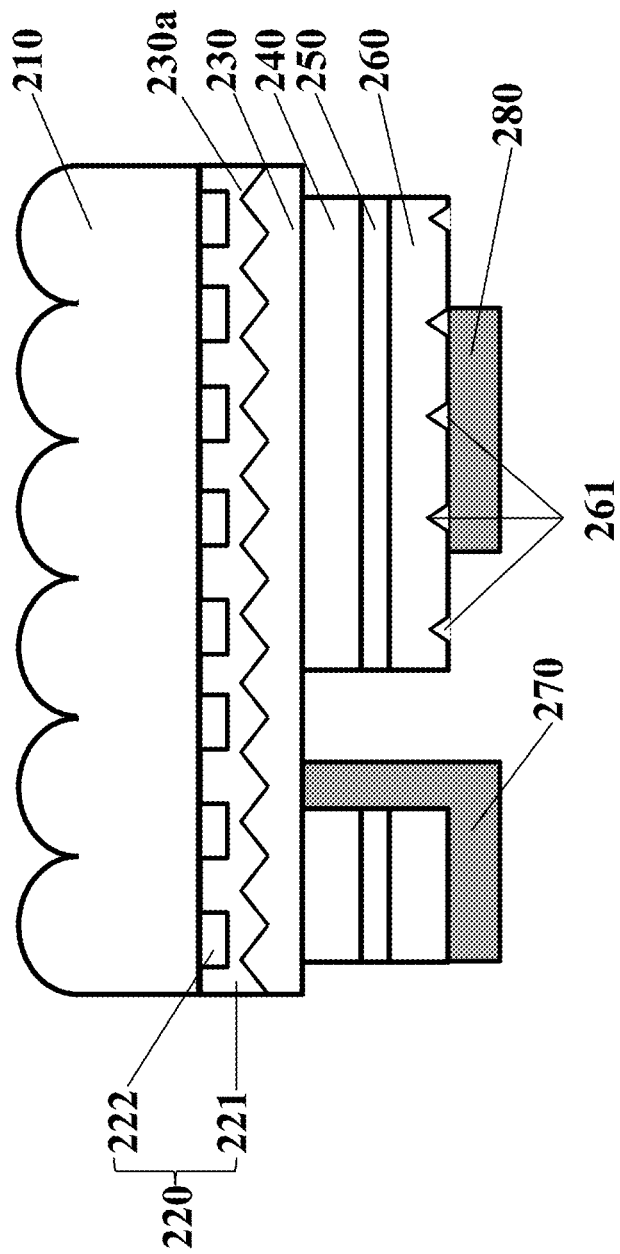
FIG. 15 illustrates the flip-chip light emitting diode of Embodiment 4.

FIG. 15 shows the flip-chip light emitting diode according to the fourth embodiment of the present disclosure, and the difference between this embodiment and Embodiment 3 is that: the lower surface of the n-type semiconductor layer 260 is etched to form pyramid-shaped recess arrays 261. Each pyramid-shaped recess corresponds to the vertical shadow area of the patterned bonding layer 222, and the diagonal length of the bottom surface is less than or equal to the diameter of the circular recess bottom layer of the patterned bonding layer 222. Therefore, light of the vertical shadow area of the patterned bonding layer 222 is reflected and deviates from this shadow area, thus eliminating light reflection of the patterned bonding layer 222 to the inside parts of the chip. The front recessed array 261 is only a preferred solution, and the present invention is not limited to this method. In other embodiments, it may also be a series of irregularly arranged recessed structures by an etching depth is 20~100 nm, preferably 30~70 nm.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A flip-chip light emitting diode comprising:
a light-emitting epitaxial laminated layer having a first surface, and a second surface opposing the first surface, and including a first semiconductor layer, an active layer, and a second semiconductor layer, wherein the first surface is a roughened surface;
a transparent bonding medium layer over the first surface of the light-emitting epitaxial laminated layer and bonded with a transparent substrate;
a first electrode and a second electrode respectively over a first electrode region and a second electrode region over the second surface of the light-emitting epitaxial laminated layer;
wherein the transparent substrate has a thickness of less than 80 μm;
wherein the transparent bonding medium layer includes a first sub-layer and a second sub-layer, wherein the first sub-layer is adjacent to the first surface of the light-emitting epitaxial laminated layer, and the second sub-layer is adjacent to the transparent substrate;
wherein the first sub-layer has a refractive index larger than a refractive index of the second sub-layer;
wherein the first sub-layer has a thickness less than 1 μm and comprises at least one of $Al_2O_3$ or $SiN_x$, configured to reduce a refractive index difference between the light-emitting epitaxial laminated layer and the transparent bonding medium layer, thereby improving a light extraction efficiency,
wherein the second sub-layer has a thickness of more than 1 μm and comprises a silicon oxide layer;
wherein the transparent bonding medium layer has a flat upper surface distal from the transparent substrate; and
wherein the second sub-layer has a circular array structure.

2. The flip-chip light emitting diode of claim 1, wherein the transparent bonding medium layer has a thickness of 1.5~4 μm.

3. The flip-chip light emitting diode of claim 1, wherein the transparent bonding medium layer has the flat upper surface proximal to the transparent substrate and a patterned lower surface distal from the transparent substrate.

4. The flip-chip light emitting diode of claim 3, wherein the flat upper surface has a roughness value Ra<1 nm.

5. The flip-chip light emitting diode of claim 1, wherein the second surface of the light-emitting epitaxial laminated layer has a portion which is etched to form a recess structure.

6. The flip-chip light emitting diode of claim 5, wherein the recess structure has a depth of 20~100 nm.

7. A flip-chip light emitting diode comprising:
a light-emitting epitaxial laminated layer having a first surface and a second surface opposing the first surface, and including a first semiconductor layer, an active layer and a second semiconductor layer;
a transparent bonding medium layer over the first surface of the light-emitting epitaxial laminated layer and bonded with a transparent substrate;
a first electrode and a second electrode respectively over a first electrode region and a second electrode region over the second surface of the light-emitting epitaxial laminated layer;
wherein the transparent substrate has a thickness of less than 80 μm;
wherein the transparent bonding medium layer comprises a high-refractivity transparent medium layer and a transparent bonding layer, wherein: the high-refractivity transparent medium layer is over the first surface of the light-emitting epitaxial laminated layer; and the transparent bonding layer is over the high-refractivity transparent medium layer;
wherein the high-refractivity transparent medium layer has a thickness less than 1 μm and comprises at least one of $Al_2O_3$ or $SiN_x$, configured to reduce a refractive index difference between the light-emitting epitaxial laminated layer and the transparent bonding medium layer, thereby improving a light extraction efficiency;
wherein the transparent bonding layer has a thickness of more than 1 μm and comprises a silicon oxide layer;
wherein the transparent bonding layer has a flat upper surface distal from the transparent substrate; and
wherein the transparent bonding layer has a circular array structure.

8. A light-emitting device comprising one or more light emitting diodes including at least one flip-chip light emitting diode according to claim 7.

9. The light-emitting device of claim 8, wherein the second surface of the light-emitting epitaxial laminated layer has a portion which is etched to form a recess structure.

10. The light-emitting device of claim 8, wherein the first surface of the light-emitting epitaxial laminated layer is a roughened surface.

11. The flip-chip light emitting diode of claim 7, wherein the high-refractivity transparent medium layer is composed of $Al_2O_3$; and the transparent bonding layer is composed of $SiO_2$.

12. The flip-chip light emitting diode of claim 7, wherein the first surface of the light-emitting epitaxial laminated layer is a roughened surface.

13. The flip-chip light emitting diode of claim 12, wherein the transparent bonding layer has the flat surface adjacent proximal to the transparent substrate, and a patterned lower surface distal from the transparent substrate.

14. The flip-chip light emitting diode of claim 7, wherein the second surface of the light-emitting epitaxial laminated layer has a portion which is etched to form a recess structure.

15. The flip-chip light emitting diode of claim 7, wherein the transparent bonding layer has a thickness of 1~2 μm.

16. A light-emitting device comprising one or more light emitting diodes including at least one light emitting diode comprising:
a light-emitting epitaxial laminated layer having a first surface and a second surface opposing the first surface, and including a first semiconductor layer, an active layer and a second semiconductor layer, wherein the first surface is a roughened surface;
a transparent bonding medium layer over the first surface of the light-emitting epitaxial laminated layer and bonded with a transparent substrate;
a first electrode and a second electrode respectively over a first electrode region and a second electrode region over the second surface of the light-emitting epitaxial laminated layer;
wherein the transparent substrate has a thickness of less than 80 μm;

wherein the transparent bonding medium layer including a first sub-layer and a second sub-layer, wherein the first sub-layer is adjacent to the first surface of the light-emitting epitaxial laminated layer, and the second sub-layer is adjacent to the transparent substrate;

wherein the first sub-layer has a refractive index larger than a refractive index of the second sub-layer;

wherein the first sub-layer has a thickness less than 1 μm and comprises at least one of $Al_2O_3$ or $SiN_x$, configured to reduce a refractive index difference between the light-emitting epitaxial laminated layer and the transparent bonding medium layer, thereby improving a light extraction efficiency;

wherein the second sub-layer has a thickness of more than 1 μm and comprises a silicon oxide layer;

wherein the transparent bonding medium layer has a flat upper surface distal from the transparent substrate; and wherein the second sub-layer has a circular array structure.

17. The light-emitting device of claim 16, wherein the first surface of the light-emitting epitaxial laminated layer is a roughened surface.

\* \* \* \* \*